(12) United States Patent
Aruga

(10) Patent No.: US 6,657,696 B2
(45) Date of Patent: Dec. 2, 2003

(54) FLEXIBLE SUBSTRATE, ELECTRO-OPTICAL DEVICE AND ELECTRONIC EQUIPMENT

(75) Inventor: Yasuhito Aruga, Suwa (JP)

(73) Assignee: Seiko Epson Corporation (JP)

( * ) Notice: Subject to any disclaimer, the term of this patent is extended or adjusted under 35 U.S.C. 154(b) by 22 days.

(21) Appl. No.: 10/077,686

(22) Filed: Feb. 15, 2002

(65) Prior Publication Data

US 2002/0117669 A1 Aug. 29, 2002

(30) Foreign Application Priority Data

Feb. 16, 2001 (JP) ........................................ 2001-040696

(51) Int. Cl.⁷ ............................................ G02F 1/1395
(52) U.S. Cl. ........................................ 349/150; 349/151
(58) Field of Search ................................. 349/150, 151, 349/149, 152, 139; 257/59, 72

(56) References Cited

U.S. PATENT DOCUMENTS

| | | | |
|---|---|---|---|
| 4,474,432 A | * | 10/1984 | Takamatsu et al. .......... 349/150 |
| 5,841,501 A | * | 11/1998 | Eiraku et al. ................ 349/150 |
| 6,518,557 B1 | * | 2/2003 | Izumi et al. .............. 250/208.1 |

* cited by examiner

*Primary Examiner*—Toan Ton
(74) *Attorney, Agent, or Firm*—Harness, Dickey & Pierce, P.L.C.

(57) ABSTRACT

The shape of the picture frame area of the electro-optical device is to be made symmetrical. The IC chip on panel is mounted in the edge area, along one side of the panel substrate of the electro-optical panel. Additionally, the IC chip on base material is mounted on the base material joined to said panel substrate. Said IC chip on base material is mounted on the surface containing the panel joining part joined to said panel substrate.

10 Claims, 10 Drawing Sheets

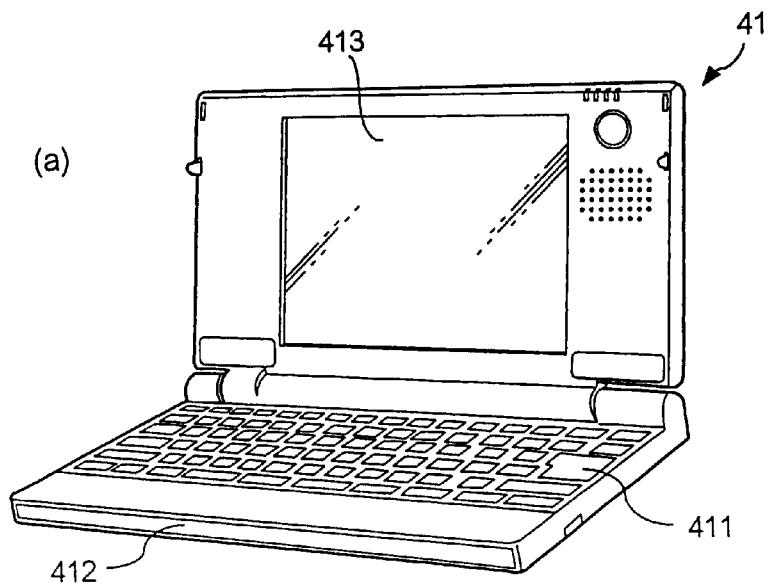
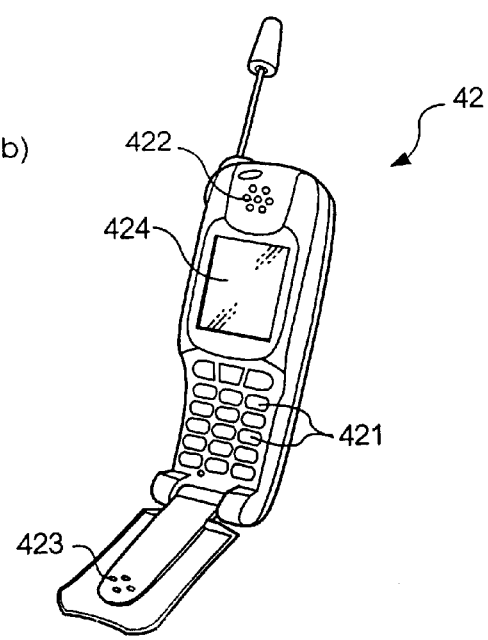
FIG. 9

FLEXIBLE SUBSTRATE, ELECTRO-OPTICAL DEVICE AND ELECTRONIC EQUIPMENT

BACKGROUND OF THE INVENTION

1. Areas of Industrial Application

This invention relates to a flexible substrate, electro-optical device and electronic equipment.

2. Prior Art

Electro-optical devices represented by display devices such as a liquid crystal display and an EL (electro luminescence) display are being widely utilized in various types of electronic equipment. In this type of electro-optical device, a composition, where an IC chip generating the signals to drive the electro-optical substances such as a liquid crystal and an EL element is mounted on the panel substrate that holds the electro-optical substances. Mounting is done utilizing the COG (chip on glass) technology (hereafter noted as "COG mounting"). This type of composition has been known. In addition, a composition has been proposed, where multiple IC chips are mounted on the panel substrate to cope with the increasingly large number of electrodes demanded by the increasing requirements for higher resolution.

FIG. 10 is a perspective drawing illustrating the composition of an electro-optical device (a liquid crystal display device in this case) equipped with multiple IC chips. As shown in the figure, this electro-optical device comprises a first panel substrate 81 and a second panel substrate 82. Each panel substrate forms an electrode on its opposing surface. They are glued together through sealing material 83. An electro-optical substance, i.e., liquid crystal, is sealed in between both substrates. The first panel 81 has an overhanging area 81a extending beyond the second panel substrate 82. A first driver IC 84 that supplies driving signals to the electrodes on the first panel substrate 81 is mounted in this area 81a. Similarly, the second panel 82 has an overhanging area 82a extending beyond the first panel substrate 81. A second driver IC 85 that supplies driving signals to the electrodes on the second panel substrate 82 is mounted in this area 82a.

However, when the composition shown in FIG. 10 is adopted, one or the other of the two panel substrates would extend beyond the other panel substrate, creating an overhanging area (81a and 82a). Consequently, the shape of the picture frame area of the electro-optical device, in other words, the shape of the outside area of the sealing material 83, would not be symmetrical either in the X-axis direction or in the Y-axis direction in the figure. On the other hand, the casings of electronic equipment, such as portable telephones, are frequently made laterally symmetrical. Therefore, there has been a problem in the conventional electro-optical device of not being able to fit easily into the casing of electronic equipment.

This invention was made considering the situation described above. The purpose is to present an electro-optical device having a symmetrically shaped picture frame area, an electronic equipment equipped with this electro-optical device, and a flexible substrate utilized in said electro-optical devices.

SUMMARY OF THE INVENTION

In order to solve the problems described above, in an electro-optical panel provided with pixels corresponding to the intersections of scanning lines and data lines, the substrate related to the present invention is provided with a base material, one edge of the base material is joined to the edge area of a panel substrate on which a panel IC chip for driving either the aforementioned scanning lines or data lines is mounted, and with a base IC chip that is mounted on surface of the base material and that drives either the aforementioned scanning lines or data lines.

According to this type of substrate, among the multiple IC chips driving the liquid crystal display panel, the panel IC chip is mounted on the panel substrate, and the base IC chip is mounted on the base material. Therefore, for example, it is not necessary to mount an IC chip in the neighborhood of the side adjacent to the side belonging to the edge area of the panel substrate. Consequently, the shape of the picture frame areas of the electro-optical device can be made symmetrical with respect to an axis perpendicular to the side belonging to the edge area of the panel substrate. In addition, the base IC chip is mounted on the surface of the base material containing a panel joining part. Therefore, the entire length of the wiring formed on the base material (for example, wiring between the panel joining part and the IC chip on base material) can be formed on one surface of the base material. Consequently, since it is not necessary to provide through holes penetrating the base material from one side of the base material to the other surface, the structure of the substrate can be simplified.

The substrate described above may be provided with wiring for the panel IC chip, which is formed on one surface of the base material to be connected to the aforementioned panel IC chip and which extends from the vicinity of the edge area in a direction approximately perpendicular to the edge area, and wherein the aforementioned base IC chip comprises a first IC chip mounted on one side of the aforementioned wiring for the panel IC chip and a second IC chip mounted on the other side. This way, the composition of the base material could be made laterally symmetrical, and the composition of the substrate can be simplified.

In this case, it would be desirable to have the first wiring, extending from the first IC chip to the neighborhood of the edge part, formed on one the surfaces of the base material, and the second wiring, extending from the second IC chip to the neighborhood of the edge part, formed on the same surface of the base material. According to this composition, not only the IC chips wiring on the panel, but also the entire length of the first wiring and second wiring can be formed on one surface of the base material.

In addition, it is desirable to provide an electronic parts group, which is positioned on one surface of the base material, which is mounted on the side opposite from the aforementioned edge area with respect to the aforementioned base IC chip on the base material, and which generates the control signals to be supplied to the aforementioned panel IC chip, the first IC chip, and the second IC chip; first input wiring, which is formed on one surface of the base material to connect the aforementioned electronic parts group to the aforementioned first IC chip; as well as with second input wiring, which is formed on one of the surfaces of the aforementioned substrate to connect the aforementioned electronic parts group to the aforementioned second IC chip, and wherein the aforementioned wiring for the panel IC chip is connected to the aforementioned electronic parts group. In this case, a composition having the external connection wiring, which connects the electronic parts group to the external equipment, formed on the one surface of the base material is also conceivable. This way, the entire length of all wiring, described above, can be formed on one surface of the base material.

In order to solve the problem described above, in an electro-optical panel provided with pixels corresponding to the intersections of scanning lines and data lines, the substrate related to the present invention is provided with a base material, one of whose edges is joined to the edge area of a panel substrate on which a panel IC chip for driving either the aforementioned scanning lines or data lines is mounted; with a base IC chip, which is mounted on one surface of the base material and that drives either the aforementioned scanning lines or data lines; and with an electronic parts group, which is positioned on one surface of the base material, which is mounted on the side opposite from the aforementioned edge area with respect to the aforementioned base IC chip on the base material, and which generates the control signals to be supplied to the aforementioned panel IC chip and base IC chip. In this type of composition, the shape of the picture frame area of the electro-optical device can be formed into a shape symmetrical with respect to a specific axis, for the same reason as that given above. In addition, the structure of the substrate can be simplified.

In addition, in order to solve the problem described above, the electro-optical device related to the present invention is provided with an electro-optical panel provided with pixels corresponding to the intersections of scanning lines and data lines, and for which a panel IC chip for driving either the aforementioned scanning lines or data lines is mounted inside the edge area along one side of the panel substrate, with a substrate having a base material one of whose edge is joined to the aforementioned edge area, and with a base IC chip, which is mounted on one surface of the base material to drive either the aforementioned scanning lines or data lines. In this type of electro-optical device, the shape of the picture frame of said electro-optical device could be made symmetrical with respect to a specific axis for the same reason as that given for the substrate described above.

In order to solve the problems described above, the electronic equipment related to this invention is characterized by being equipped with the electro-optical devices as described above. As mentioned above, the electro-optical device of this invention has a picture frame area shape that is symmetrical with respect to a specific axis. Consequently, it is particularly suitable for electronic equipment provided with a casing symmetrical with respect to a specific axis as a casing to accommodate said electro-optical device.

BRIEF DESCRIPTION OF THE DRAWINGS

FIG. 9(a) is a perspective drawing showing the composition of a personal computer as an example of electronic equipment where the electro-optical device of this invention is applied. FIG. 9(b) is a perspective drawing showing the composition of a portable telephone as an example of electronic equipment where the electro-optical device of this invention is applied.

DETAILED DESCRIPTION OF THE PREFERRED EMBODIMENTS

An embodiment of this invention will be explained with reference to the drawings. The embodiment is only one of the configurations of this invention, and it is not to limit the scope of this invention. Any modification of the configuration is possible within the scope of the technical concept of this invention. A liquid crystal display device utilizing liquid crystal as electro-optical substance will be described as an example of the electro-optical device of this invention.

Figure 1:
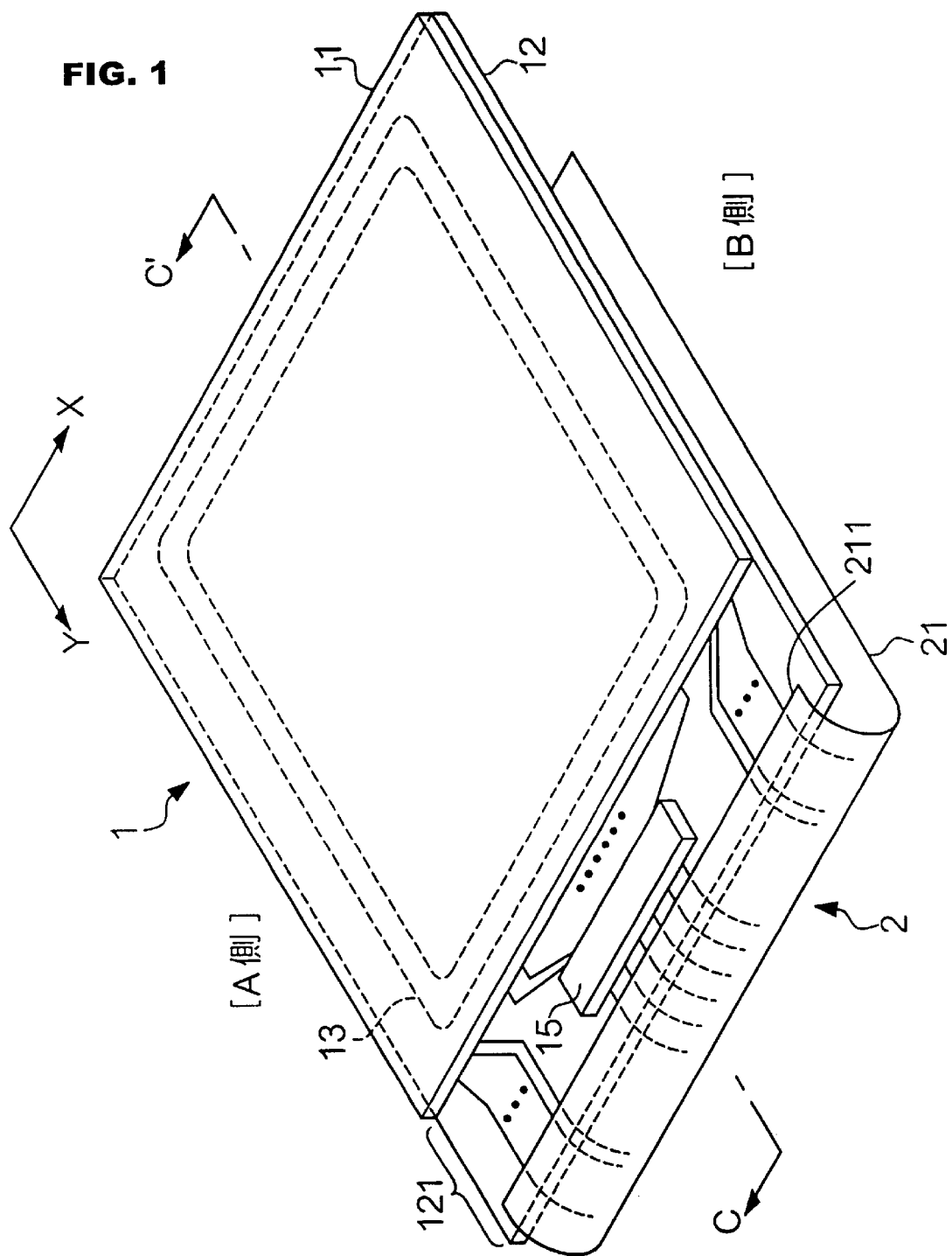
FIG. 1 is a perspective drawing showing the exterior view of the liquid crystal display device according to one embodiment of this invention.
Figure 2:
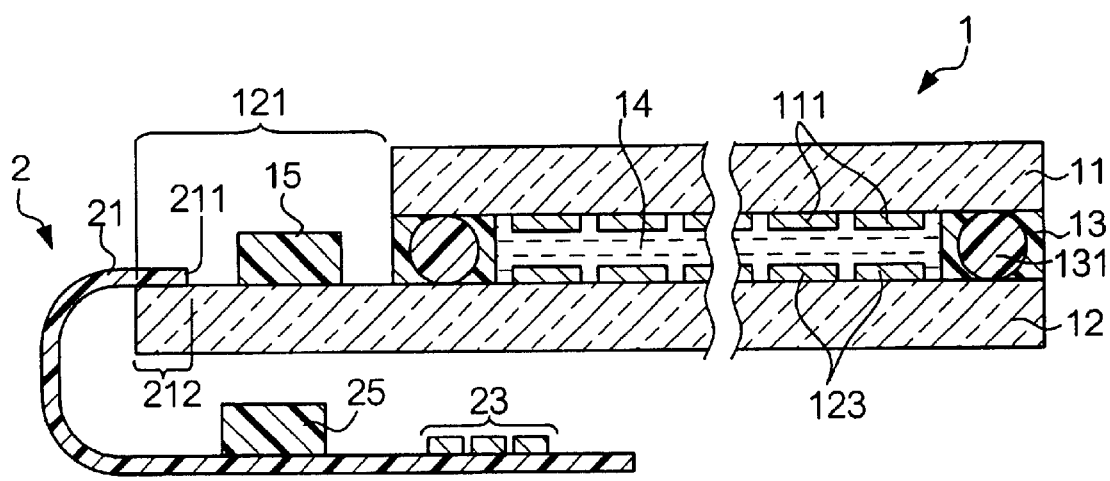
FIG. 2 is a cross-sectional drawing of a view taken along line C–C' shown in FIG. 1.

First, a configuration where this invention is applied to an active matrix type liquid crystal display device, utilizing a two-terminal switching element, TFD (Thin Film Diode), as a switching element, will be explained. FIG. 1 is a perspective view-showing the exterior view of this liquid crystal display device. FIG. 2 shows a cross-sectional view taken along Line C–C' shown in FIG. 1. Hereafter, the negative direction of the X-axis will be indicated as "side A" and the positive direction of the X-axis will be indicated as "side B" as indicated in FIG. 1.

This liquid crystal display device has a liquid crystal display panel 1 and a flexible wiring substrate 2 attached to said liquid crystal display panel, as shown in FIG. 1 and FIG. 2. The liquid crystal display panel 1 has a first panel substrate 11 and a second panel substrate 12, which are glued together through an approximately rectangular-sealing material 13 and liquid crystal 14 sealed in the area surrounded by the two substrates and the sealing material 13. Conductive particles 131 are scattered in the gap between the two substrates to function as spacers to maintain a constant gap between the two substrates. In addition, the second panel substrate 12 has an area that overhangs over the first panel substrate 11 on one side. (In other words, it is an area where the second panel substrate does not face the first panel substrate 11. Hereafter, this area is indicated as "edge area 121".) On the other hand, part of the flexible wiring substrate 2 is attached to edge area 121. At the same time, flexible wiring substrate 2 is bent over so that it reaches the backside of said liquid crystal display panel 1. Incidentally, a backlight unit to illuminate light onto said liquid crystal display panel 1 is installed between the part of flexible wiring substrate 2, bent over toward the backside of the liquid crystal display panel 1, and the second panel substrate 12. However, this is omitted from the illustration.

Figure 3:
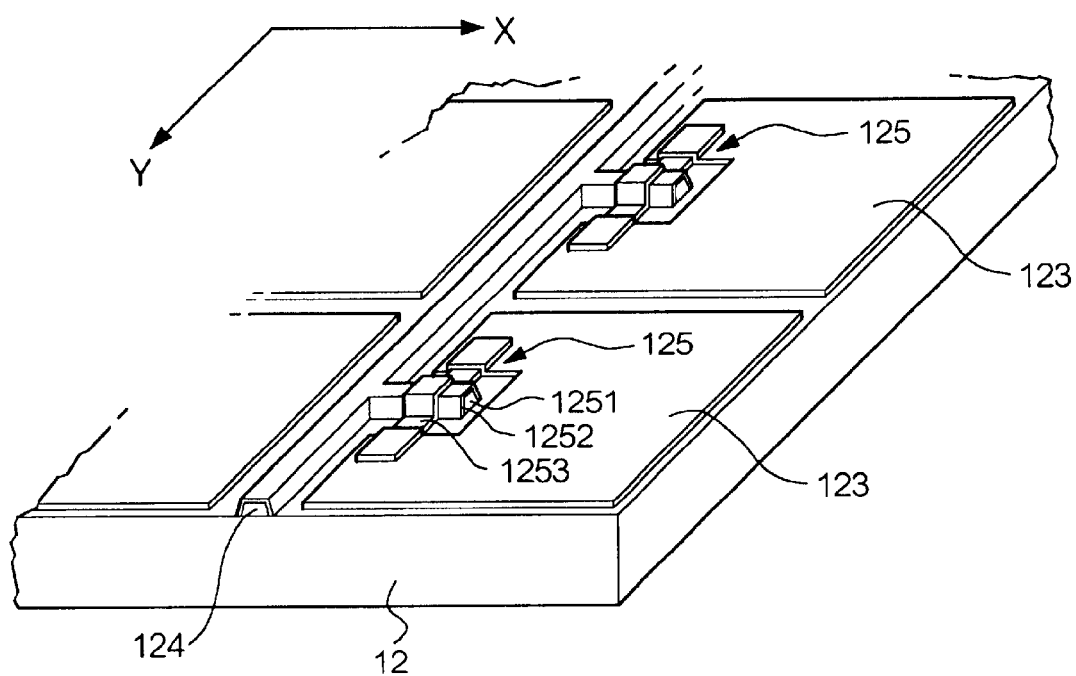
FIG. 3 is a perspective drawing showing a magnified view of the components on the No. 1 panel substrate, in the liquid crystal panel composing the liquid crystal display device.

The first panel substrate 11 and the second panel substrate 12 of the liquid crystal display panel 1 are transparent substrates made from glass or quartz. On the inner surface of the second panel substrate 12 (liquid crystal 14 side), multiple pixel electrodes 123 are arranged in a matrix shape, and multiple data lines 124 are formed extending in the Y-axis direction in the gap between individual pixel electrodes 123, as shown in FIG. 3. Each pixel electrode 123 is formed with transparent conductive material such as ITO (Indium Tin Oxide). The pixel electrode 123 and the data line 124 laid adjacent to said pixel electrode 123, are connected via TFD125. Each TFD comprises a first metallic film 1251 that forms a branch from the data line 124, an oxide film 1252, formed on the surface of the first metallic film 1251 by such means as oxidation of anode, and a second metallic film 1253 formed on the upper surface of the oxidation film 1252 to connect to the pixel electrode 123. Each TFD forms a two-terminal switching element with a non-linear current-voltage characteristics.

Figure 4:
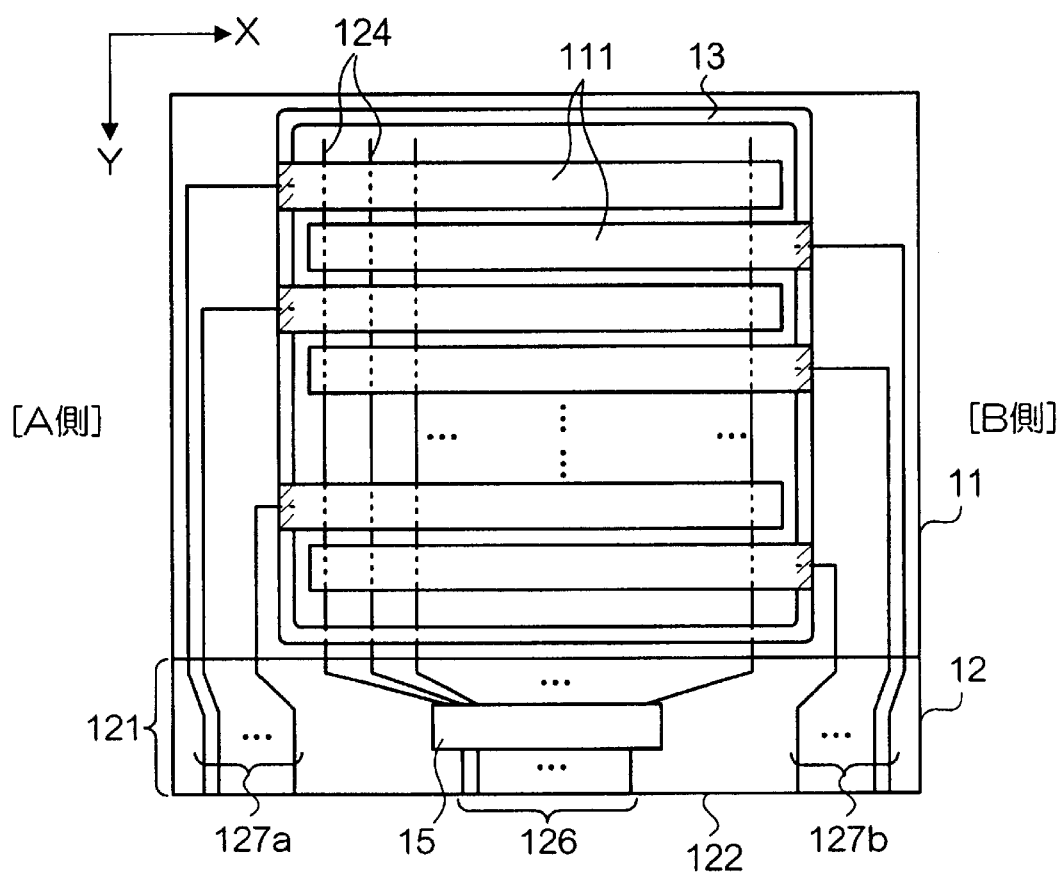
FIG. 4 is a plan view drawing showing the configuration of the wiring of the liquid crystal display panel.

FIG. 4 shows a typical drawing of the configuration of wiring of the liquid crystal display panel 1 related to the embodiment of this invention. The illustration of pixel electrode 123 and TFD 125 are omitted from the drawing to prevent it from becoming overly complicated. As shown in the figure, each data line 124 crosses one side of the sealing material 13 (bottom side in FIG. 4) to extend into the edge area 121.

An X driver IC 15 is COG mounted on the second panel substrate 12 near the center of the edge area 121 in the X-axis direction. The X driver IC 15 is provided with a circuit to supply data signal to each data line mentioned above, and is mounted onto the second panel substrate 12 through an anisotropic conductive film, which has conductive particles, scattered in the adhesive agent. In other words, the ends of each data line 124, mentioned above, reaching the edge area 121 are connected electrically to the output terminal of the X driver IC 15 through the conductive particles in the anisotropic conductive film. In addition, multiple panel terminals 126 are formed, in the edge area 121. They extend from the area where the X driver IC 15 is mounted on the base material joining side 122 of the second panel substrate 12. The panel terminals 126 are connected to the input terminal of the X driver IC, by means of the conductive particles of the anisotropic conductive film.

On the other hand, multiple scanning lines 111 are formed on the inside surface (liquid crystal 14 side) of the first panel substrate 11. They extend in the direction to intersect the data line 124, in other words in the X-axis direction. Each scanning line 111 is a band shaped electrode formed by a transparent conductive material such as ITO. The scanning lines face the multiple pixel electrodes 123, which form a line on the second panel substrate 12. With this type of composition, the liquid crystal 14 changes its alignment direction according to the voltage applied between the scanning line 111 and the pixel electrodes 123. In other words, the area, where the scanning line 111 and the pixel electrode 123 intersects, functions as a pixel. That is to say, a pixel is formed corresponding to the intersection of the data line 124 and the scanning line 111.

Each of the multiple scanning lines 111 in the embodiment of this invention are extended out alternately to side A and side B. The edge of the part extended out is arranged in such a manner that it overlays the sealing material 13. In other words, counting from the top of FIG. 4, the odd-numbered scanning line 111 (hereafter, indicated simply as "odd-numbered scanning line 111") is made to overlay side A of the sealing material 13. In other words, it is extended between the first panel substrate 11 and the sealing material 13. On the other hand, the even-numbered scanning lines 11, counting from the top of FIG. 4 (hereafter, indicated simply as "even-numbered scanning line 111") are extended so that they overlay the sealing material 13 on side B.

Panel wiring 127a and 127b are formed on side A and side B, respectively, of the sealing material 13 on the inside surface of the second panel substrate. One end of each panel wiring 127a is in contact with side A of the sealing material 13, and reaches the base material joining side 122 of the base material of the edge area 121, after passing through side A of the X driver IC 15. Similarly, one end of each panel wiring 127b is in contact with side B of the sealing material 13, and reaches the base material joining side 122 of the edge area 122 after passing through side B of the X driver IC 15. By this composition, the multiple scanning lines 111 formed on the first panel substrate 11 are electrically connected to the panel wiring 127a or 127b through the conductive particles 131 scattered in the sealing material 13. In other words, of the multiple scanning lines 111, the odd-numbered scanning lines 111 are connected to the panel wiring 127a through side A of the sealing material 13. On the other hand, the even-numbered scanning lines 111 are connected to the panel wiring 127b through side B of the sealing material 13.

The inside surfaces of the first panel substrate 11 and the second panel substrate 12 are covered with alignment film that has been treated with rubbing process in a prescribed direction. On the other hand, the polarizing plate to polarize the incoming light and the phase difference plate to compensate the interference color are glued onto the outer surfaces. However, their illustration and explanation are omitted here because they are not directly related to this invention.

Next, the composition of the flexible wiring substrate 2 will be explained. As shown in FIG. 1 and FIG. 2, the flexible wiring substrate 2 is provided with a film base material 21. This film base material is made of material such as polyimide, forming a flexible, film-like part. The part in the neighborhood of the edge part of one surface of the film base material 21 (hereafter indicated as "joining side edge part 211") is connected to the edge area 121 of the second panel substrate 12. The connection is made through an anisotropic conductive film in which conductive particles are scattered in the adhesive agent. Hereafter, the part of film, base material 21 joined to the second panel substrate 12 will be indicated as "panel joining part 212", and the surface containing this panel joining part 212 will be indicated as the "mounting surface". In other words, when the flexible wiring substrate 2 is mounted on the liquid crystal display panel 1, as shown in FIG. 1 and FIG. 2, the surface facing the second panel substrate 12 of the film base material 21 is the mounting surface. As will be described in detail below, various electronic parts and wiring related to the driving of the liquid crystal panel 1 are all placed on the mounting surface of the film base material 21 in the embodiment of this invention.

Figure 5:
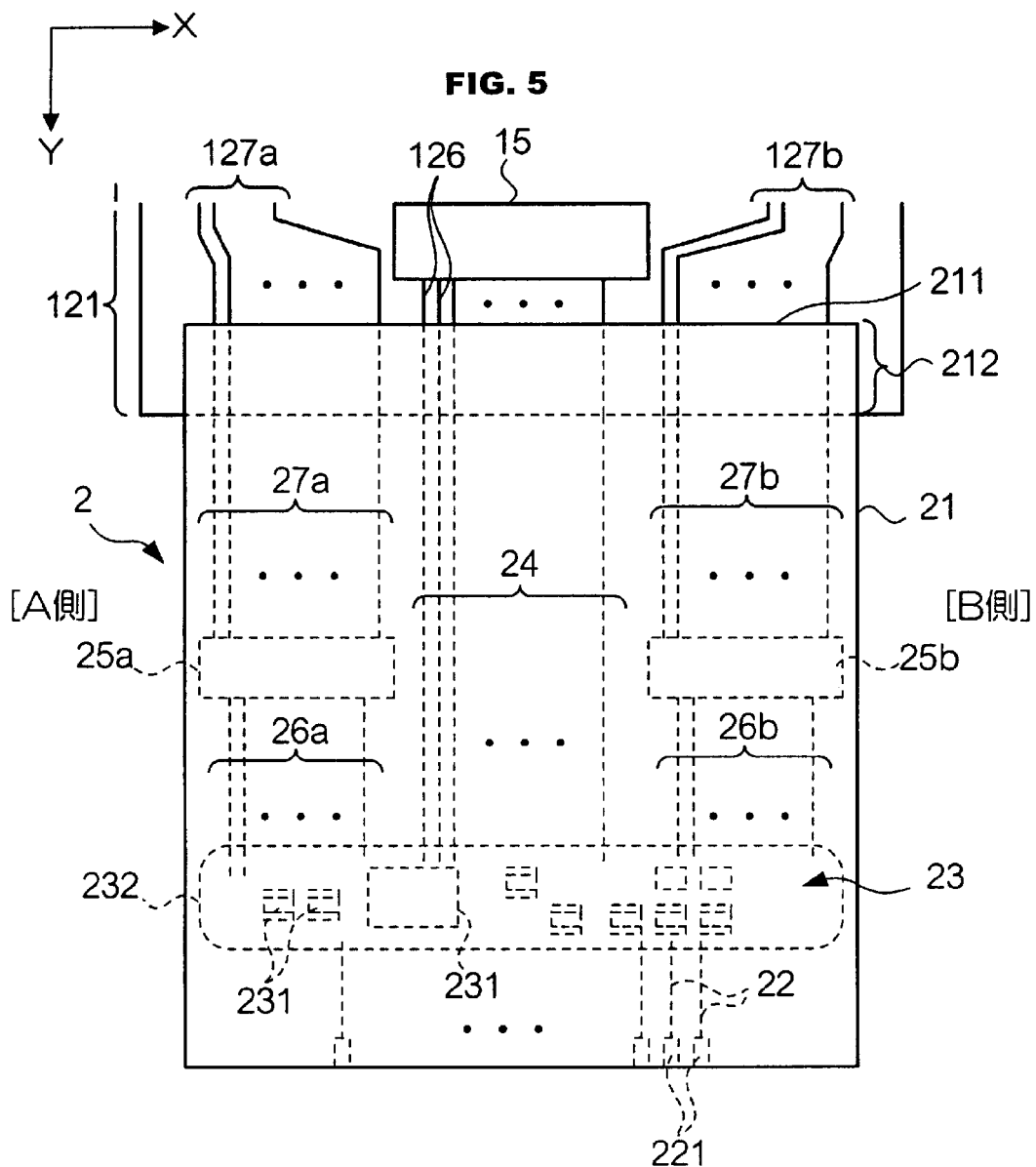
FIG. 5 is a plan view drawing showing the components on the mounting surface of the base material of the flexible wiring substrate related to this embodiment.
Figure 6:
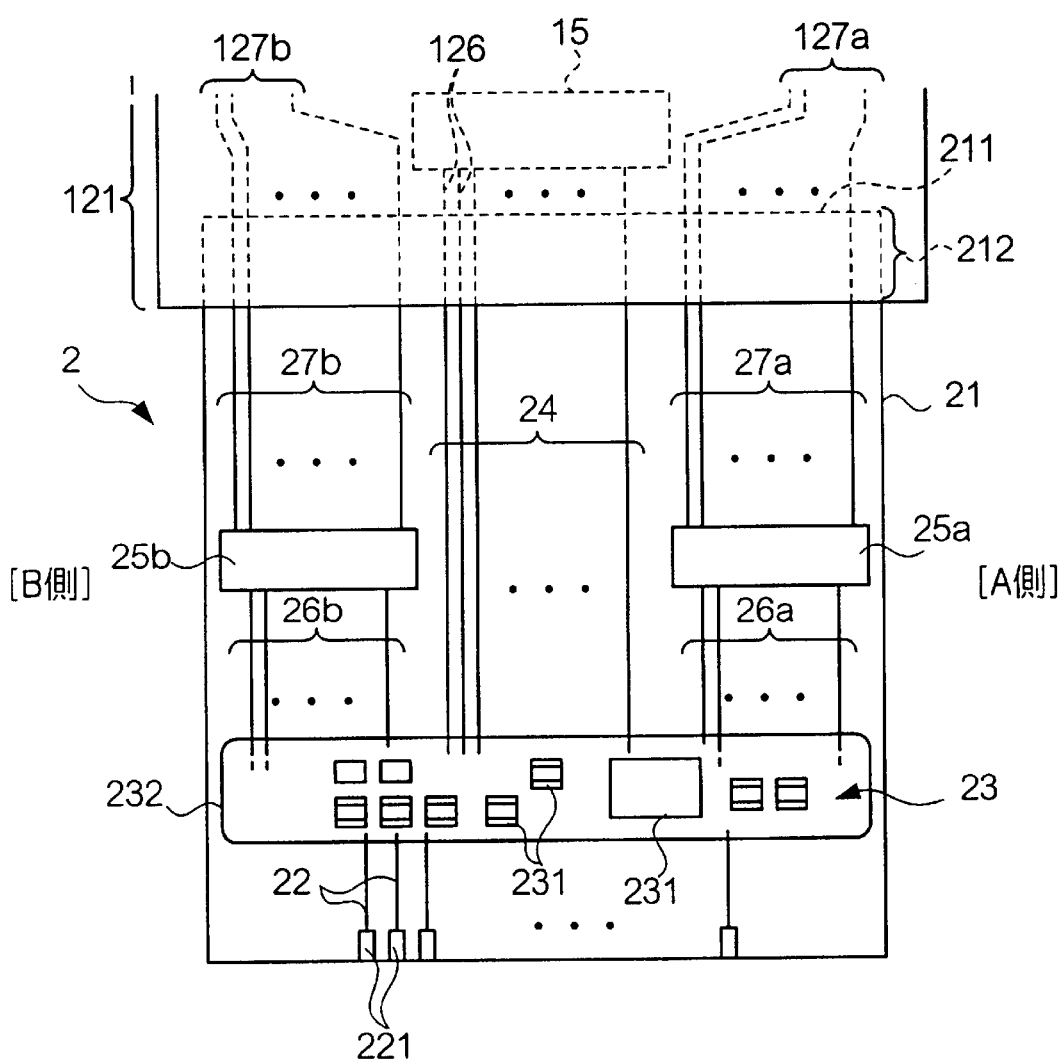
FIG. 6 is a plan view drawing showing the components on the surface opposite from the mounting surface of said base material.

FIG. 5 is the plan view drawing that shows the composition on the surface on the side opposite from the mounting surface of the film base material 21. FIG. 6 shows a plan view of the composition on the mounting surface. It is cautioned that in these figures, "side A" and "side B" become reversed. Incidentally, for the convenience of explanation, in FIG. 5 and FIG. 6, the flexible wiring substrate 2 is shown in the state before it is bent over. In addition, in FIG. 5, the elements positioned on the backside of the drawing, with respect to the film base material 21, are shown in dotted lines.

As shown in these figures, the following elements are provided on the mounting surface of the film base material 21. The elements include: an external connection line 22, electronic parts group for driver control 23, X driver input wiring 24, Y driver IC 25 (25a and 25b), Y driver input wiring 26 (26a and 26b), and a Y driver output wiring 27 (27a and 27b). The external connection line 22, X driver input wiring 24, Y driver input wiring 26, and the Y driver output wiring 27 are wiring made of copper layer with gold plating. They are formed on the surface of the film base material 21.

The external connection line 22 is the wiring that connects the electronic parts group for driver control 23 to external equipment, not shown in the figure. In other words, the external connection line 22 extends from the external connection terminal 221, formed in the neighborhood of the edge part on the opposite side of the joining side edge part 211 of the film base material 21, to the electronic parts group for driver control 23.

The electronic parts group for driver control 23 comprises multiple electronic parts 231. It generates control signals (such as clock signals) to regulate the operation of the X driver IC 15, Y driver IC 25a and 25b based on the signals supplied from the external equipment via the external connection line 22. These electronic parts 231 comprise, for example, chips containing booster circuit, oscillation circuit, or power supply circuit, and the likes, chip condenser and resistors. The mounting area for the electronic parts group for driver control 23 on the film base material 21 is covered with epoxy or acrylic resist 232.

The X driver input wiring 24 is the wiring to connect the electronic parts group for driver control 23 to the X driver IC 15. In other words, the X driver input wiring 24 extends in the direction perpendicular to the joining side edge part 211, from the neighborhood of the central part in the X-axis direction of the panel joining part 212, reaching the mounting area of the electronic parts group for driver control 23 and connecting to each electronic part 231. The end part of the X driver input wiring 24, positioned in panel joining part 212, is connected to the panel terminal 126, located on the second panel substrate 12, via the conductive particles in the anisotropic conductive film. By this type of composition, the control signals generated by the electronic parts group for driver control 23 are supplied to the X driver IC 15 via the X driver input wiring 24 and the panel terminal 126.

The Y driver IC 25a and 25b are provided with circuits to generate scanning signals to be supplied to each scanning line 11, and are mounted in the area between the mounting area of the electronic parts group for driver control 23 and the joining side edge part 211 of the mounting surface of the film base material 21. Additionally, the Y driver IC 25a and 25b are installed apart from each other separated by the X driver input wiring 24 running across the center of the film base material 21 in the Y-axis direction. In other words, as shown in FIG. 5 and FIG. 6, the Y driver IC 25a is mounted corresponding with the X driver input wiring 24 in the side A area. On the other hand, the Y driver IC 25b is mounted corresponding with the X driver input wiring 24 in the side B area.

The Y driver input wiring 26a is the wiring to connect the electronic parts group for driver control 23 with the Y driver IC 25a, and is formed on the mounting area located in the side A area, as viewed from the X driver input wiring 24. Under this type of composition, the Y driver IC 25a generates and outputs the scanning signal to the odd-numbered scanning line 111, based on the control signal supplied from the electronic parts group for driver control 23, via the Y driver input wiring 26a. On the other hand, the Y driver input wiring 26b is the wiring to connect the electronic parts group for driver control 23 with the Y driver IC 25b, formed on the mounting area located in the side B area, as viewed from the X driver input wiring 24. The Y driver IC 25b generates and outputs the scanning signal to the even-numbered scanning line 111, based on the control signal supplied from the electronic parts group for driver control 23, via the Y driver input wiring 26b.

One end of the Y driver output wiring 27a is connected to the output terminal of the Y driver IC 25a. At the same time, Y driver output wiring 27a passes through the side A area with respect to the X driver input wiring 24 extending in the Y axis direction. The other end of Y driver output wiring 27a is formed to reach the panel joining part 212. The Y driver output wiring 27a, reaching the panel joining part 212, and the panel wiring 127a on the second panel substrate 12 are electrically connected via the conductive particles in the anisotropic conductive film. Under this type of composition, the scanning signal output from the Y driver IC 25a is supplied to the odd-numbered scanning line 111 via the Y driver output wiring 27a and panel wiring 127a. On the other hand, the Y driver output wiring 27b extends from each terminal of the Y driver IC 25b in the Y-axis direction. At the same time, the end part reaching the panel joining part 212 is connected to the panel wiring 127b on the second panel substrate 12. By this arrangement, the scanning signal output from the Y driver IC 25b is supplied to the even-numbered scanning line 111 via the Y driver output wiring 27b and the panel wiring 127b.

By operating the Y driver IC 25a and the Y driver IC 25b in concert under the composition described above, the scanning signal is supplied to all scanning lines 111 in succession. Consequently, each scanning 111 is successively selected every horizontal scanning period. For example, in a certain horizontal scanning period, the scanning signal output from the Y driver IC 25a is supplied to the first scanning line from the top. In the next horizontal scanning period, the scanning signal output from the Y driver IC 25b is supplied to the second scanning line 111 from the top. Then, in the next horizontal scanning period, the scanning signal output from the Y driver IC 25a is supplied to the third scanning 111 from the top, and so on.

As explained above, according to the present embodiment, the X driver IC 15 is mounted in the edge area 121 of the second panel substrate 12. At the same time, the flexible wiring substrate 2, equipped with Y driver IC 25a and 25b, is joined in said edge area 121. In other words, since there is no need to provide Y driver IC 25a and 25b to drive the scanning line 111 on the panel, the picture frame area of said liquid crystal display panel can be made in a shape symmetrical with respect to the axis parallel with the Y-axis (more accurately, the center line of the first panel substrate 11 or the second panel substrate 12.) Therefore, when fitting the liquid crystal display panel 1 into a casing having a laterally symmetrical shape, the mechanism to support the liquid crystal display panel 1 inside said casing could be made laterally symmetrical. Consequently, the design and manufacturing of said casing could be simplified.

Figure 10:
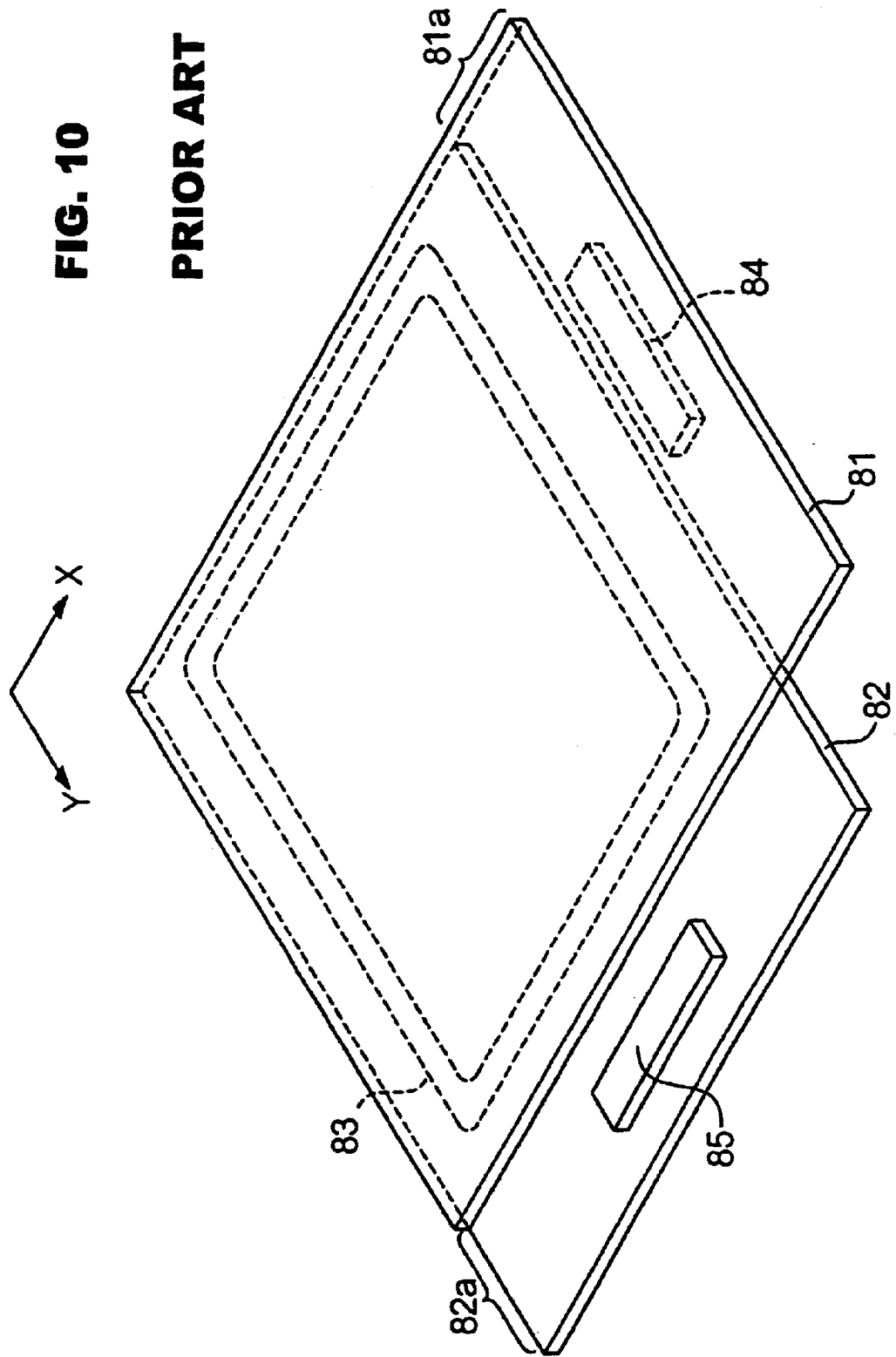
FIG. 10 is a perspective drawing showing the composition of a conventional electro-optical device.

In addition, according to the present embodiment, the second panel substrate 12 has the edge area 121 to mount the X driver IC 15, whereas the first panel substrate 11 does not have such an area. Therefore, compared with the conventional electro-optical device (refer to FIG. 10) where both panel substrates have overhanging area extending beyond the other panel substrate, the present embodiment provides the advantage of a smaller picture frame area.

Additionally, in the present embodiment, various electronic parts and wiring related to the driving of the liquid crystal panel are mounted only on one surface (mounting surface) of the film base material 21. If these various elements are mounted on both sides of the film base material 21, it becomes necessary to provide through holes in the film base material 21 to connect individual elements, raising the manufacturing costs as a result. Contrary to this, in the present embodiment, all of the elements could be connected on one surface, without the need for the through holes. Therefore, the manufacturing costs could be held lower. In addition, when wiring is formed on both sides of the film base material 21, each wiring must be formed at a relatively wide pitch (for example, approximately 100 μm) according to the current manufacturing technology. In contrast, when wiring is formed only on one surface of the film base material 21, the wiring could be formed at a much narrower pitch (for example, approximately 60 μm). Since wiring is formed only on one surface of the surface of the film base material 21 in the present embodiment, the pitch of wiring could easily be made narrower. Consequently, for example, even when it becomes necessary to form a larger number of wires to provide higher resolution of display, a larger number of wiring with narrow pitch could be formed easily.

Furthermore, according to the present embodiment, the Y driver IC 25 (25a and 25b) and the electronic parts group for driver control 23 are mounted on the same side surface of the film base material 21. Therefore, the Y driver IC 25 could be mounted easily on the same side surface of film base material 2i where the electronic parts group for driver control 23 is mounted. This is described in more detail below.

Figure 7:
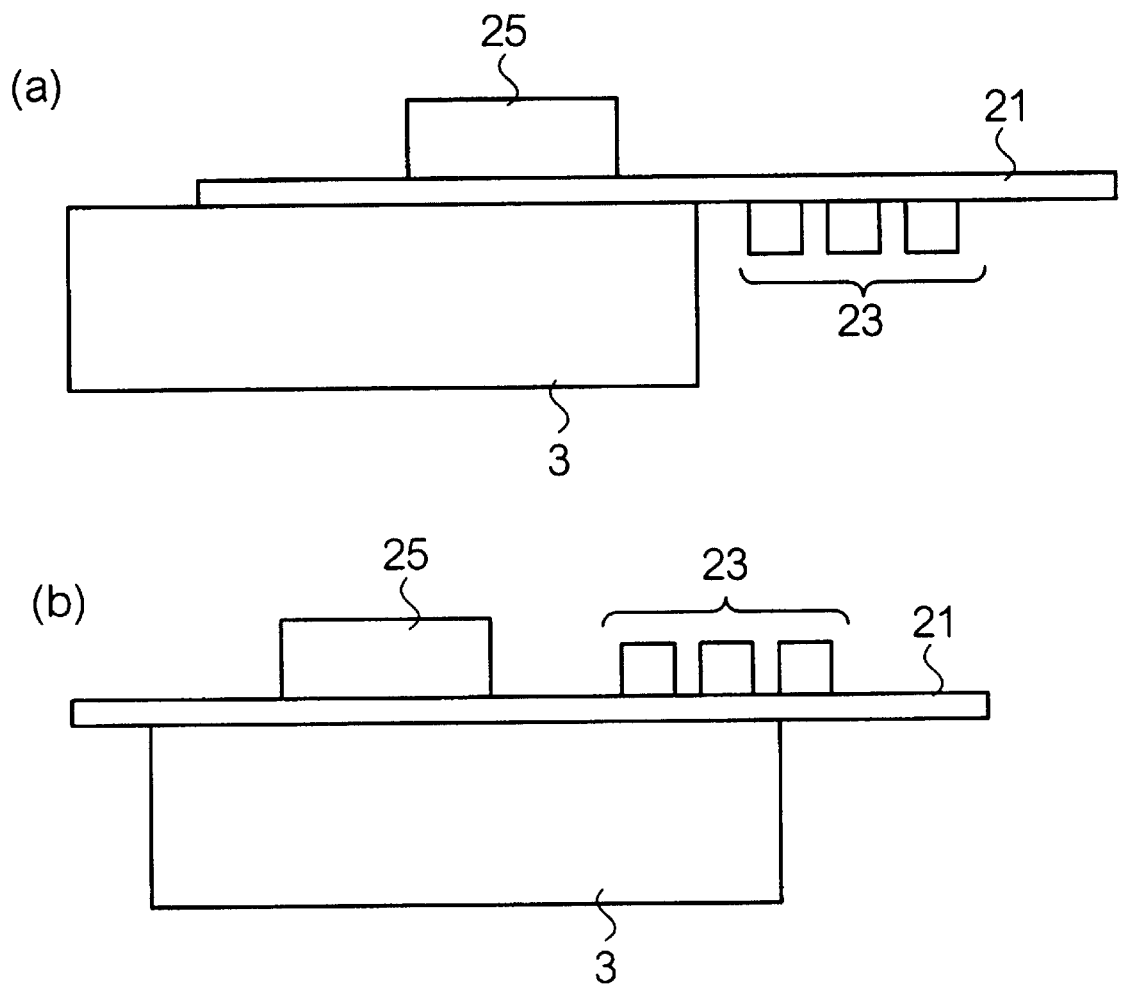
FIG. 7 is a drawing explaining the processes of mounting the Y driver IC on the film base material.

Here, a case is assumed in which the Y driver IC 25 and the electronic parts group for driver control 23 are mounted on different surfaces of film base material 21, as an example to provide a comparison with this configuration of embodiment. In this case, for example, the electronic parts group for driver control 23 is mounted on one surfaces of the film base material 21 first. Then, the Y driver IC 25 is attached with pressure to the other surface of the film base material 21 via the anisotropic conductive film. For the process of mounting the Y driver IC 25, it is necessary to place the surface of the film base material 21 on a pedestal so that the surface on which the Y driver IC 25 is mounted is on the upper side. However, the electronic parts group for driver control 23 has already been mounted, forming protrusions on the other side surface of the film base material 21. Consequently, the position of the film base material 21 must be carefully selected to avoid placing the electronic parts group for driver control 23 on the upper surface of the pedestal 3, as shown in FIG. 7(a).

In contrast, according to the present embodiment, the Y driver IC 25 and the electronic parts group for driver control 23 are formed on the same side surface of the film base material 21. Therefore, as shown in FIG. 7(b), there is no need to limit the position of the film base material 21 to any specific position in the process of mounting the Y driver IC 25. Consequently, mounting of the Y driver IC 25 can be made much easier.

A configuration of an embodiment of this invention was described above. However, the aforementioned embodiment is only an example. Various modifications may be made to the aforementioned embodiment within the scope of the concept of this invention. As an example of modified configuration, the following configuration could be considered.

Figure 8:
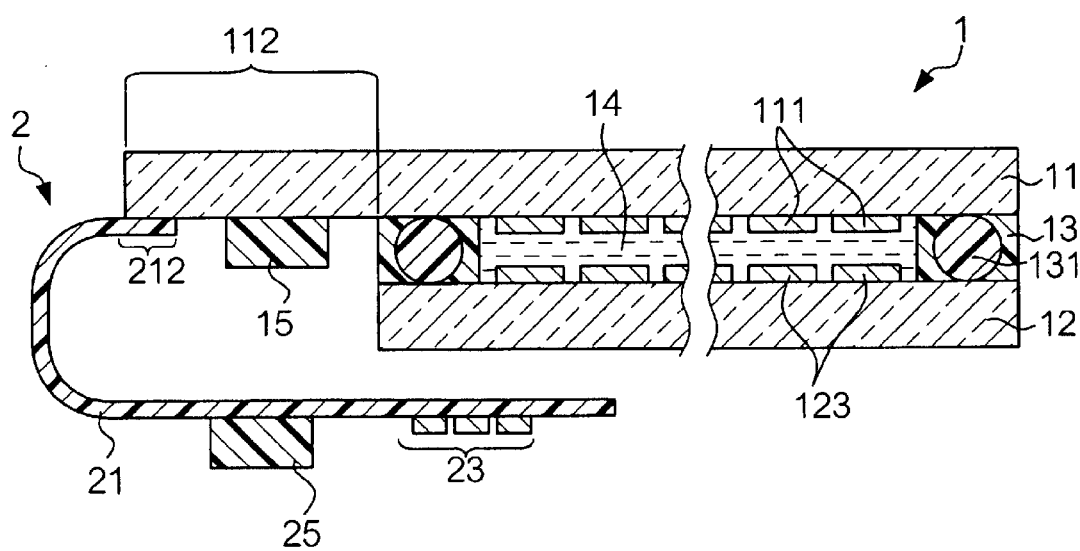
FIG. 8 is a cross-sectional drawing showing the composition of the electro-optical device (liquid crystal display device) in a modified example of this invention.

(1) In the aforementioned embodiment, an edge area 121 hanging over beyond the first panel substrate 11 positioned on the viewer side was provided in the second panel substrate 12 positioned in the backside. The X driver IC 15 was COG mounted on said edge area 121. This is the configuration assumed. However, the composition of the electro-optical device related to this invention is not limited to this composition. For example, the composition shown in FIG. 8 could be considered. In this composition, the first panel substrate 11 positioned on the viewer's side has an edge area 112 overhanging beyond the second panel substrate 12 on the backside. The X driver IC 15 is COG mounted on this edge area 112. The flexible wiring substrate 2 is bent toward the backside of the liquid crystal panel 1 while the panel joining part 212 in the neighborhood of the edge part is joined to said edge part 112. In this case, the surface containing the panel joining part 212 of the film base material 21, in other words, the mounting surface, would be the surface on the opposite side of the surface facing the second panel substrate 12. That is to say, when the configuration shown in FIG. 8 is adopted, the mounting surface of the film base material 21, where the wiring, Y driver IC 26, and the electronic parts group for driver control 23 are to be mounted, would be the surface on the opposite side as viewed from the liquid crystal display panel 1 compared with that in the composition adopted (Refer to FIG. 2) in the aforementioned embodiment.

(2) In the aforementioned embodiment, (34) an X driver IC 15, to which one chip containing the circuits supplying the data signal to the multiple data lines 124 is mounted, was utilized. However, these circuits could be divided, and each circuit could be mounted on multiple different chips and COG mounted on the second panel substrate 12. On the other hand, in the aforementioned embodiment, the circuits to drive the data line have been divided into two chips (driver IC 25a and 25b). However, Y driver ICs integrated into one chip could be utilized, as well.

In addition, in the aforementioned embodiment, the X driver IC 15 that supplies data signal to the data line 124 was COG mounted on the second panel substrate 12. The Y driver IC 25 (25a and 25b) that supplies scanning signal to the scanning line 111 was mounted on the film base material 21. However, the Y driver IC 25 could be COG mounted on the second panel substrate 12, and the X driver IC 15 could be mounted on the film base material 21, in opposite arrangement.

(3) In the aforementioned embodiment, an active matrix type liquid crystal display device utilizing a two-terminal switching element, i.e., TFD 125, was shown as an example. Of course, a liquid crystal display device utilizing three-terminal switching element represented by TFT (Thin Film Transistor), and liquid crystal display device of passive matrix type, not using any switching element, could be applied to this invention, as well.

(4) In the aforementioned embodiment, an example in which this invention was applied to a liquid crystal display device using liquid crystal 14 as electro-optical substance was shown. It is possible to apply this invention to various display devices producing displays by means of the electro-optical effects using an EL element, such as an organic EL (electroluminescence) element, as the electro-optical substance. In other words, so long as the electro-optical device adopts a composition where wiring is formed on the edge area of the panel substrate, this invention is applicable regardless of what the configuration of other element is like. Incidentally, when a composition is adopted where only one sheet of panel substrate is used to hold the electro-optical substance, such as in the case of electro-optical device using EL element as the electro-optical substance, the edge area, where the X driver IC (IC chip on the panel) and the flexible wiring substrate are placed, would be the area containing one side of said panel substrate. In other words, the "edge area" of this invention is not limited to an area of panel substrate overhanging beyond the other panel substance. It signifies the area along one side of the panel substrate.

Next, electronic equipment utilizing the electro-optical device related to this invention will be explained.

First, an example of a portable personal computer (so-called notebook personal computer) to which electro-optical device of this invention is applied to its display will be explained. FIG. 9(a) is a perspective view of this personal computer showing its composition. As shown in the figure, the personal computer 41 comprises a main unit 412 provided with a keyboard 411 and a display section 413 where an electro-optical device of this invention is applied.

Next, an example of a portable telephone to which electro-optical device of this invention is applied to its display will be explained. FIG. 9(b) is a perspective view of this portable telephone showing its composition. As shown in the figure, the portable telephone 42 comprises an earpiece 422, a microphone 423 in addition to the multiple operating buttons 421. It also comprises a display section 424 where an electro-optical device of this invention is applied.

As for the electronic equipment to which electro-optical device of this invention could be applied, in addition to the personal computer shown in FIG. 9(a) and portable telephone shown in FIG. 9(b), liquid crystal television, view finder type/direct viewing monitor type video tape recorder, car navigation device, pager, electronic notepad, electronic calculator, word processor, workstation, video telephone, POS terminal, digital still camera and the likes could be enumerated. As mentioned above, according to the electro-optical device of this invention, the shape of its picture frame could be made symmetrical with respect to an axis perpendicular to the direction of one side of the edge area of the panel substrate (in other words, center line of the panel substrate). Consequently, the degree of freedom in the design of electronic equipment mounted with such electro-optical device could be improved. In addition, its manufacturing could be simplified.

As explained above, according to the electro-optical device of this invention, the shape of its picture frame could be made symmetrical.

The entire disclosure of Japanese Patent Application No. 2001-040696 filed Feb. 16, 2001 is incorporated by reference herein.

What is claimed is:

1. A substrate joined to an electro-optical panel on which a panel IC chip is mounted, comprising:

a base material joined to the electro-optical panel; and a first base IC chip mounted on the base material, wherein electro-optical panel includes data lines and scanning lines, wherein the panel IC chip supplies driving signals to at least ones of the data lines and scanning lines, and wherein the base IC chip supplies driving signals to the other of the data lines and the scanning lines.

2. A substrate according to claim 1, further comprising wirings formed on the base material and connected to the panel IC chip, and a second base IC chip mounted on the base material, wherein the wirings are positioned between the first and the second base IC chip.

3. A substrate according to claim 2, further comprising, a plurality of second electronic parts that generate signals for controlling the second base IC chip, and a plurality of second input wirings that connect the second base IC chip and the second electronic parts.

4. A substrate according to claim 1, further comprising a first output wiring connected to the first base IC chip.

5. A substrate according to claim 4, further comprising a second output wiring connected to the second base IC chip.

6. A substrate according to claim 1, further comprising a plurality of first electronic parts that generate signals for controlling the first base IC chip, and a plurality of first input wirings that connect the first base IC chip and the first electronic parts.

7. A substrate according to 6, further comprising external connection wirings, formed on the base material, for connecting the first electric parts and an external device.

8. A substrate according to claim 6, wherein the first electronic parts are mounted on a side opposite to a side where the first base IC chip is mounted.

9. An electro-optical device comprising:

an electro-optical panel;

a panel IC chip mounted on the electro optical panel;

a base material joined to the electro-optical panel; and a first base IC chip mounted on the base material, the electro-optical panel including data lines and scanning lines, the panel IC chip supplying driving signals to at least ones of the data lines and scanning lines, and the base IC chip supplying driving signals to the other of the data lines and the scanning lines.

10. Electronic equipment provided with the electro-optical device described in claim 9.

* * * * *

UNITED STATES PATENT AND TRADEMARK OFFICE
CERTIFICATE OF CORRECTION

PATENT NO.     : 6,657,696 B2
DATED          : December 2, 2003
INVENTOR(S)    : Aruga It is certified that error appears in the above-identified patent and that said Letters Patent is hereby corrected as shown below:

<u>Title page,</u>
Item [75], Inventor, residence, "Suwa (J)" should be -- Matsumoto (JP) --

<u>Column 2,</u>
Line 40, after "one" insert -- of --

<u>Column 5,</u>
Line 58, "lines 11" should be -- lines 111 --

<u>Column 6,</u>
Line 4, "area 122" should be -- area 121 --

<u>Column 7,</u>
Line 37, "line 11" should be -- line 111 --

<u>Column 8,</u>
Lines 23 and 31, after "scanning" insert -- line --

<u>Column 9,</u>
Line 19, "material 2i" should be -- material 21 --
Line 27, "surfaces" should be -- surface --

<u>Column 10,</u>
Line 15, "Refer" should be -- refer --

UNITED STATES PATENT AND TRADEMARK OFFICE
CERTIFICATE OF CORRECTION

PATENT NO. : 6,657,696 B2
DATED : December 2, 2003
INVENTOR(S) : Aruga

It is certified that error appears in the above-identified patent and that said Letters Patent is hereby corrected as shown below:

Column 12,
Line 4, "ones" should be -- one --
Line 26, after "to" insert -- claim --
Line 28, "electric" should be -- electronic --
Line 39, "ones" should be -- one --

Signed and Sealed this

Twenty-second Day of June, 2004

JON W. DUDAS
*Acting Director of the United States Patent and Trademark Office*